United States Patent [19]
Yen et al.

[11] Patent Number: 5,962,345
[45] Date of Patent: Oct. 5, 1999

[54] METHOD TO REDUCE CONTACT RESISTANCE BY MEANS OF IN-SITU ICP

[75] Inventors: Ming-Shuo Yen, Tai-tung; Horng-Wen Chen, Taichung; Pei Hung Chen, Hsin-chu, all of Taiwan

[73] Assignee: Taiwan Semiconductor Manufacturing Company, Ltd., Hsin-Chu, Taiwan

[21] Appl. No.: 09/114,130

[22] Filed: Jul. 13, 1998

[51] Int. Cl.$^6$ ................................................. H01L 21/00
[52] U.S. Cl. ........................ 438/709; 438/704; 438/710; 438/706
[58] Field of Search .................... 438/704, 706, 438/709, 710, 711

[56] References Cited

U.S. PATENT DOCUMENTS

| | | | |
|---|---|---|---|
| 4,341,592 | 7/1982 | Shortes et al. | 156/643 |
| 4,545,851 | 10/1985 | Takada . | |
| 4,581,101 | 4/1986 | Senoue et al. | 438/706 |
| 4,689,112 | 8/1987 | Bersin | 438/709 |
| 4,699,689 | 10/1987 | Bersin | 438/709 |
| 4,718,976 | 1/1988 | Fujimura | 438/710 |
| 5,272,417 | 12/1993 | Ohmi | 315/111.21 |
| 5,368,710 | 11/1994 | Chen et al. | 204/192.32 |
| 5,716,534 | 2/1998 | Tsuchiya et al. | 438/710 |

OTHER PUBLICATIONS

Chang et al, "ULSI Technology", McGraw Hill Companies, 1996, pp. 348–351.
Elliott, "Integrated Circuit Fabrication Technology" McGraw Hill Book Company, 1982, pp. 305–307.

Primary Examiner—Benjamin Utech
Assistant Examiner—Duy-Vu Deo
Attorney, Agent, or Firm—George O. Saile; Stephen B. Ackerman

[57] ABSTRACT

A process is described for etching contact holes though a dielectric layer down to a silicon surface. Initial etching, until the silicon is exposed, is performed in a suitable plasma environment under high RF power. This results in damage to the newly exposed silicon surface. Said damage is repaired by exposing the silicon and the photoresist to an atmosphere that includes carbon tetrafluoride and atomic oxygen. The latter oxidizes the damaged layer, allowing it to be removed by the former. Much of the photoresist is also removed by the atomic oxygen, any that still remains being then removed using a wet etch. At the user's option, the silicon may be allowed to overetch during the high RF power application and/or a low power RF step may be introduced to partially remove silicon surface damage prior to the atomic oxygen treatment.

18 Claims, 1 Drawing Sheet

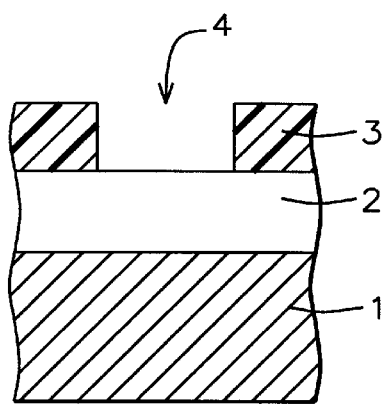
FIG. 1 - Prior Art
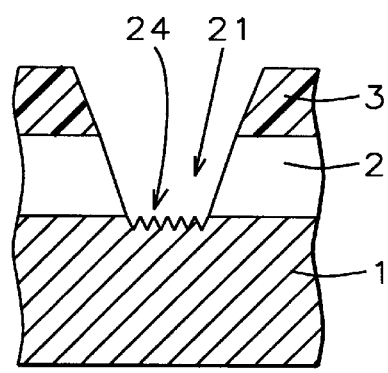
FIG. 2 - Prior Art
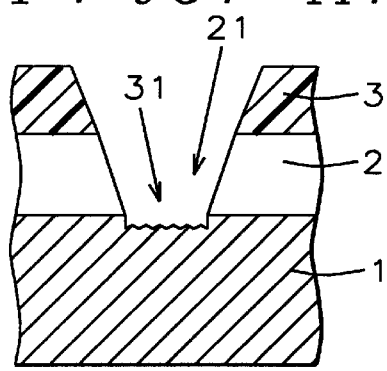
FIG. 3 - Prior Art
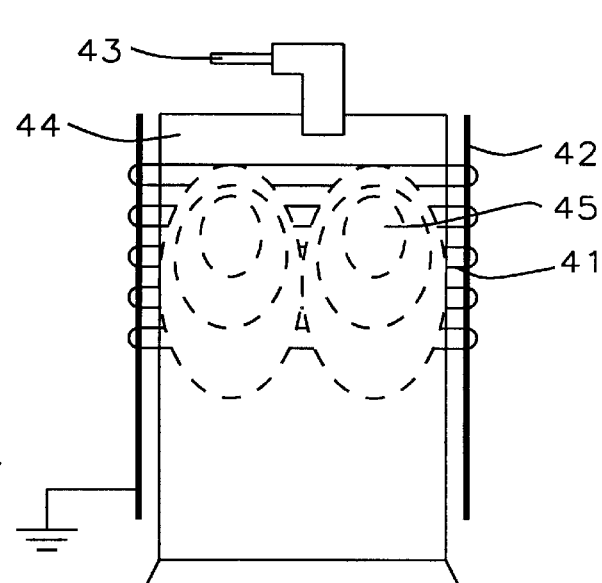
FIG. 4
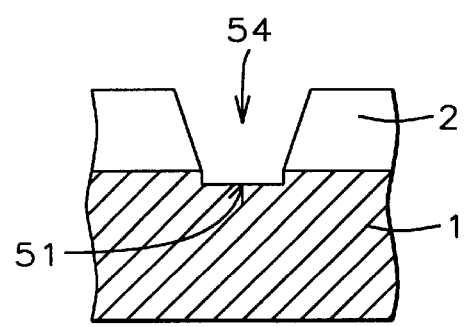
FIG. 5

METHOD TO REDUCE CONTACT RESISTANCE BY MEANS OF IN-SITU ICP

FIELD OF THE INVENTION

The invention relates to the general field of silicon integrated circuits with particular reference to making low resistance contact to a silicon surface, through a hole etched in a layer of a dielectric.

BACKGROUND OF THE INVENTION

During the fabrication of integrated circuits, plasma etching is widely used to etch through a dielectric layer in order to form a hole through which an underlying silicon surface can be conatcted. Plasma etching is normally effected by means of a high frequency (RF) discharge of a gas containing atomic species that attack the dielectric—typically one of the halogens.

Plasma etching is thus a combination of chemical effects by molecules whose activity has been increased by virtue of their being ionized and/or transformed into free radicals or atoms and physical effects resulting from ion bombardment. Both mechanisms are effective in removing material but the bombardment effects often leave behind a residue of surface damage.

In FIG. 1 we illustrate schematically a silicon substrate 1 on whose surface is dielectric layer 2 in which a hole needs to be etched so that the silicon can be contacted. The area that is to be etched is defined by opening 4 in photoresist layer 3. The latter was deposited onto 2 and then exposed through a suitable optical mask so that, after development, resist 3 covered the dielectric everywhere except at 4.

FIG. 2 illustrates the appearance of the structure after the completion of plasma etching. Typically this would have been at a high RF power level, between about 1,200 and 1,400 watts, using a gas such as trifluoromethane in argon at a pressure of about 0.3 torr and a chamber wall temperature of about 40° C. As shown, hole 21 has been etched through dielectric layer 2 but there is significant surface damage 24 to the exposed silicon surface.

In order to minimize the extent of surface damage (such as 24) it has been the practice in the prior art to sometimes follow the plasma etch described above with a so-called soft etch wherein the RF power level is reduced to a significantly lower level (typically about 160 watts in this example) and maintained at this reduced level for about 10 seconds. Following the soft etch, the structure was exposed to a plasma of pure oxygen for about 1 minute. This has the effect of removing most of the photoresist. Any photoresist that still remained was then removed using a wet etch such as a mixture of sulphuric acid and hydrogen peroxide in water.

The problem with the prior art procedure that we have described above is that the soft etch step does not remove all the surface damage. Even though it is performed at reduced power relative to the main etch there are still present energetic ions that can damage the silicon surface. Additionally, removal of the photoresist in an oxygen plasma, while effective for that purpose, also introduces some surface damage since, once again, energetic ions are present. The net result of these practices is illustrated in FIG. 3 which shows that although surface damage 31 has been reduced relative to prior damage 24 (FIG. 2) it has still not been eliminated. The presence of such residual surface damage is found to correlate with an increase in the contact resistance between the silicon and a conductor deposited in the hole.

A secondary problem, associated with the prior art procedures described above, is that the match box (used to match the impedance of the power supply to that of the discharge) is optimized for high power operation and a sudden switch to low power can cause damage to the match box.

The present invention provides a way to remove the last remnants of surface damage to the silicon while also removing photoresist. In an examination of the published prior art nothing was found that anticipated the present invention. Several references were, however, found to be of interest. For example, ICP (induced Coupled Plasma) etching is described by Chang and Sze in ULSI Technology pp. 348–351 (McGraw Hill 1997) while the removal of photoresist by plasma etching is discussed by Elliott in Integrated Circuit Fabrication Technology pp. 305–307 (McGraw Hill 1982).

Chen et al. (U.S. Pat. No. 5,368,710 Nov. 1994) describe generation of a plasma by external means and transmitted through a dielectric window whose thickness varies so that the plasma is weakest where the window is thickest. Shortes et al. (U.S. Pat. No. 4,341,592 Jul. 1982) use an atmosphere that includes ozone for the removal of photoresist. Ohmi (U.S. Pat. No. 5,272,417 Dec. 1993) use two separate power sources that operate at different frequencies and drive separate (but opposing) electrodes, to generate a plasma.

SUMMARY OF THE INVENTION

It has been an object of the present invention to provide a method for making contact, with low contact resistance, to silicon that has been covered by a dielectric layer.

Another object of the invention has been to provide an etching method, through said dielectric to the silicon, which results in no surface damage to the silicon surface exposed by the etching process.

These objects have been achieved by first etching at high RF power till the silicon surface is reached and then removing photoresist, while at the same time time repairing surface damage to the exposed silicon surface. This is done by exposing the silicon and the photoresist to an atmosphere that includes carbon tetrafluoride and atomic oxygen. The latter oxidizes the damaged layer at the silicon surface, allowing it to be removed by the former. Any photoresist that remains is then removed using a wet etch. At the user's option, the silicon may be allowed to overetch during the high RF power application and/or a low power RF step may be introduced to partially remove silicon surface damage prior to the atomic oxygen treatment.

BRIEF DESCRIPTION OF THE DRAWINGS

FIG. 1 shows a silicon layer coated with a dielectric through which a contact hole is to be etched.

FIG. 2 shows that surface damage of the silicon will occur at the bottom of the contact hole.

FIG. 3 shows how (in the prior art) surface damage to the silicon can be reduced, but not eliminated.

FIG. 4 is a schematic drawing of an ICP generator.

FIG. 5 shows how (through the present invention) surface damage to the silicon at the bottom of the contact hole is eliminated.

DESCRIPTION OF THE PREFERRED EMBODIMENTS

The method of the present invention begins in the same way as the prior art described above. That is, a photoresist pattern is formed on the surface of a dielectric layer which in turn covers a silicon substrate (or lower layer). This is shown in FIG. 1. Etching of the dielectric layer (wherever it is not protected by photoresist) then proceeds by use of a plasma, generated at an RF power level between about 1,200 and 1,400 watts. As illustrated in FIG. 2, this results in the formation of hole 22, extending all the way to the silicon where surface damage 24 has been introduced.

At the user's option, etching at the above stated RF power level may be allowed to proceed for between about 30 and 40 seconds after the silicon surface is known to have been reached. The purpose of this optional overetching step is to avoid blind contact but this has no effect on the aforementioned surface damage.

Also as previously discussed, the surface damage can be reduced to some extent by continuing to plasma etch at a reduced RF power level, typically between about 140 and 180 watts. This is also an option available to the user. It has the advantage of reducing contact resistance but still suffers from the possibility that the match box may get damaged. As we saw in FIG. 3, introducing this optional step still leaves surface damage 31 in place.

Removal of the remaining surface damage is accomplished in the next step, which is a key feature of the present invention. Instead of using an oxygen plasma, as practised by the prior art, the newly uncovered silicon surface (with its attendant damaged layer) is exposed to an atmosphere that includes carbon tetrafluoride and unionized atomic oxygen (the remaining gas usually being molecular oxygen). The atomic oxygen is a chemically active species which is very effective for the removal of photoresist through oxidation (sometimes called ashing). The oxygen atoms are also very effective at converting the damaged silicon to silicon oxide which is then readily converted to a removable gaseous form by the carbon tetrafluoride. The result is the removal of the damaged layer in a short time (between about 15 and 30 seconds), without the generation of fresh damage, as well as the removal of most of the photoresist.

To illustrate how an atmosphere that included atomic oxygen was produced, we refer to FIG. 4. Seen there is a schematic view of an ICP (Induced Coupled Plasma) generator. The principal components of the ICP include a plasma chamber 44, made of materials that are compatible with fluorine, a specially designed Faraday shield surrounding the chamber, and excitation coils 41 to which the RF power is applied.

Oxygen, containing between about 2 and 6 volume percent of carbon tetrafluoride (or similar halogen bearing compound), is admitted to chamber 44 through inlet 43. A pumping system (not shown) is used to create a dynamic pressure balance of between about 0.9 and 1.1 torr when the oxygen is admitted at a flow rate of between about 3,000 and 5,000 SCCM and the carbon tetrafluoride at between about 40 and 80 SCCM.

Once the pressure inside the chamber has stabilized, RF power between about 900 and 1,000 watts is applied to the coils 41, resulting in the generation of plasma 45. Although generation of the plasma is confined to the volume surrounded by the coils, the plasma itself drifts out of this volume in the direction of the pumping system. Shortly after emerging from the generation area this downstream plasma flows past metal screen 46 which is given a negative bias so that electrons in the plasma are repelled and positive ions are collected. An additional feature of mesh 46 is that it serves as an optical baffle so that no energetic photons (ultraviolet light) can get past it.

Thus, only neutral species emerge on the far side of screen 46. Said neutral species are primarily oxygen molecules with a small proportion of oxygen atoms which, as already mentioned, are very effective for oxidizing the damaged silicon surface without inducing fresh damage. Furthermore, The possiblity of radiation damage by energetic photons is also eliminated.

The silicon wafer 47 is exposed to the atomic oxygen and carbon tetrafluoride for between about 15 and 30 seconds during which time it is maintained at a temperature between about 245 and 255° C. (with 250° C. being preferred). This results in an etch rate of the silicon between about 20 and 40 Angstroms per minute.

Since some photoresist generally remains after the ashing treatment, the last of the photoresist is then removed using a wet etch such as an aqueous mixture of sulphuric acid and hydrogen peroxide which is applied at between about 120 and 140° C. for between about 6 and 10 minutes.

At the conclusion of the above series of steps, it is found that there is essentially no damage to the silicon surface at the bottom of the contact hole. This is illustrated in FIG. 5 where contact hole 54 is shown as passing through dielectric 2 down into silicon 1 whose surface 51 at the bottom of the hole is free of damage.

In addition to confirmation of the efficacy of the present invention through the examination of comparative micrographs, its beneficial effects on contact resistance have been directly confirmed through direct measurements of contact resistance in several different contexts. These results are summarised in TABLE I below:

TABLE I

| Contact type | OLD PROCESS | | INVENTION | |
| --- | --- | --- | --- | --- |
| | mean | STD | mean | STD |
| $R_c$_P+ | 110.6 | 4.2 | 92.7 | 2.6 |
| $R_c$_N+ | 40.2 | 0.88 | 35.2 | 0.45 |
| $R_c$_Co/via | 42.4 | 1.3 | 38.0 | 0.70 |
| $R_c$_Po | 3.36 | 0.092 | 3.46 | 0.061 |

All contact resistances in Table I are in ohms. STD refers to an averge for all the sites that were tested. The contact type refers to the conductive material that was deposited in the hole to make the contact. N+ and P+ refers to the substrate polysilicon, Co/via is a cobalt via and Po is deposited polysilicon.

While the invention has been particularly shown and described with reference to the preferred embodiments thereof, it will be understood by those skilled in the art that various changes in form and details may be made without departing from the spirit and scope of the invention.

What is claimed is:

1. An etching method for contacting a silicon body through a dielectric layer, comprising the sequential steps of:

(a) forming a photoresist pattern on said dielectric layer;

(b) at an RF power level, plasma etching the dielectric layer, wherever it is not covered by the photoresist, until a surface of the silicon body is uncovered;

(c) exposing said uncovered silicon surface to an atmosphere that includes carbon tetrafluoride and unionized atomic oxygen, obtained from an ICP oxygen source from which all ions and emitted ultraviolet light have been removed, thereby removing photoresist and plasma induced damage of the uncovered silicon surface; and (d) then removing any remaining photoresist by means of a wet etch.

2. The method of claim 1 further comprising, between steps (b) and (c), overetching the silicon body at said RF power level.

3. The method of claim 1 wherein said atmosphere is at a pressure between about 0.9 and 1.1 torr.

4. The method of claim 1 wherein the carbon tetrafluoride is present within said atmosphere at between about 2 and 6 volume %.

5. The method of claim 1 wherein said atmosphere is dynamically maintained by pumping thereon while admitting gas at between about 3,000 and 5,000 SCCM.

6. The method of claim 1 wherein the silicon body is maintained at a temperature between about 245 and 255° C. during execution of step (c).

7. The method of claim 1 wherein said RF power level for plasma etching is between about 1,200 and 1,400 watts.

8. The method of claim 1 wherein step (c) is executed for between about 15 and 30 seconds.

9. An etching method for contacting a silicon body through a dielectric layer, comprising the sequential steps of:
 (a) forming a photoresist pattern on said dielectric layer;
 (b) at a first RF power level, plasma etching the dielectric layer, wherever it is not covered by the photoresist, until a surface of the silicon body is uncovered;
 (c) at a second RF power level, that is less than said first power level, continuing plasma etching, thereby removing some photoresist and some plasma induced damage of the uncovered silicon surface;
 (d) exposing said uncovered silicon surface to an atmosphere that includes carbon tetrafluoride and unionized atomic oxygen, obtained from an ICP oxygen source from which all ions and emitted ultraviolet light have been removed, thereby removing more photoresist and all plasma induced damage of the uncovered silicon surface; and
 (e) then removing any remaining photoresist by means of a wet etch.

10. The method of claim 9 wherein step (c) is executed for between about 10 and 15 seconds.

11. The method of claim 9 further comprising, between steps (b) and (c), overetching the silicon body at said first RF power level.

12. The method of claim 9 wherein said atmosphere is at a pressure between about 0.9 and 1.1 torr.

13. The method of claim 9 wherein the carbon tetrafluoride is present within said atmosphere at between about 2 and 6 volume %.

14. The method of claim 9 wherein said atmosphere is dynamically maintained by pumping thereon while admitting gas at between about 3,000 and 5,000 SCCM.

15. The method of claim 9 wherein the silicon body is maintained at a temperature between about 245 and 255° C. during execution of step (d).

16. The method of claim 9 wherein said first RF power level for plasma etching is between about 1,200 and 1,400 watts.

17. The method of claim 9 wherein said second RF power level for plasma etching is between about 140 and 180 watts.

18. The method of claim 9 wherein step (d) is executed for between about 15 and 30 seconds.

* * * * *